(12) United States Patent
Yuasa et al.

(10) Patent No.: US 9,947,840 B2
(45) Date of Patent: Apr. 17, 2018

(54) LIGHT EMITTING DEVICE AND LIGHT SOURCE

(71) Applicant: NICHIA CORPORATION, Anan-shi (JP)

(72) Inventors: Taiki Yuasa, Tokushima (JP); Masaki Hayashi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/635,203

(22) Filed: Jun. 28, 2017

(65) Prior Publication Data

US 2018/0006197 A1    Jan. 4, 2018

(30) Foreign Application Priority Data

Jun. 29, 2016 (JP) ................................. 2016-129052

(51) Int. Cl.
| | |
|---|---|
| H01L 33/00 | (2010.01) |
| H01L 33/50 | (2010.01) |
| H01L 33/60 | (2010.01) |
| H01L 33/52 | (2010.01) |
| H01L 33/32 | (2010.01) |
| H01L 27/15 | (2006.01) |

(52) U.S. Cl.
CPC ............ *H01L 33/504* (2013.01); *H01L 27/15* (2013.01); *H01L 33/32* (2013.01); *H01L 33/507* (2013.01); *H01L 33/52* (2013.01); *H01L 33/60* (2013.01)

(58) Field of Classification Search
CPC ...... H01L 33/504; H01L 33/32; H01L 33/507; H01L 33/52; H01L 33/60; H01L 27/15
USPC .......................................................... 257/89
See application file for complete search history.

(56) References Cited

U.S. PATENT DOCUMENTS 9,219,201 B1 * 12/2015 Todorov ................ H01L 33/502
2016/0003440 A1    1/2016 Wataya et al.

FOREIGN PATENT DOCUMENTS

| | | |
|---|---|---|
| JP | 2007-088248 | 4/2007 |
| JP | 2010-192614 | 9/2010 |
| JP | 2011-012091 | 1/2011 |
| JP | 2011-204406 | 10/2011 |
| JP | 2016-092401 | 5/2016 |
| WO | WO 2014/136674 | 9/2014 |

* cited by examiner

*Primary Examiner* — Tu-Tu Ho
(74) *Attorney, Agent, or Firm* — Mori & Ward, LLP

(57) ABSTRACT

A light emitting device includes at least one light emitting element to emit a first light having a first peak emission wavelength in a range of 420 nm to 480 nm and at least one fluorescent material to convert the first light to a second light having a second fluorescent peak wavelength in a range of 610 nm to 750 nm. The second light has chromaticity existing in an enclosed area in a CIE 1931 chromaticity diagram in which chromaticity is defined by x and y coordinates. The enclosed area is enclosed with a first straight line, a second straight line, a third straight line, and a curved line.

12 Claims, 6 Drawing Sheets

LIGHT EMITTING DEVICE AND LIGHT SOURCE

CROSS-REFERENCE TO RELATED PATENT APPLICATION

The present application claims priority under 35 U. S. C. § 119 to Japanese Patent Application No. 2016-129052, filed Jun. 29, 2016. The contents of this application are incorporated herein by reference in their entirety.

BACKGROUND

Field of the Invention

The present disclosure relates to a light emitting device and a light source.

Discussion of the Background

Light emitting devices containing light emitting diodes (LEDs) have been used in a wide range of applications such as for displays, warning lamps, indicators, luminaries, and so forth.

For example, diode lamps including a blue light emitting element and a yellow fluorescent material that can emit yellow light upon being excited by the blue light, and configured to emit light of can be excited by the blue light and light emitting fluorescent material configured to emit visible color light have been known (for example, see Japanese Unexamined Patent Application Publication No. 2007-088248). Also, there have been known lighting configurations for vehicle tale lamps and/or brake lamps, in which, a blue light emitting diode and a fluorescent material configured to convert light from the blue light emitting diode to red light are used (for example, see Japanese Unexamined Patent Application Publication No. 2011-204406).

SUMMARY

According to one aspect of the present invention, a light emitting device includes at least one first light emitting element to emit a first light having a first peak emission wavelength in a range of 420 nm or greater and 480 nm or less, and at least one fluorescent material to convert the first light to a second light having a second peak emission wavelength in a range of 610 nm or greater and 750 nm or less. The second light has chromaticity existing in an enclosed area in a CIE 1931 chromaticity diagram in which chromaticity is defined by x and y coordinates. The enclosed area is enclosed with a first straight line, a second straight line, a third straight line, and a curved line. The first straight line connects a first point at which x is equal to 0.666 and y is equal to 0.334 and a second point at which x is equal to 0.643 and y is equal to 0.334. The second straight line connects the second point and a third point at which x is equal to 0.576 and y is equal to 0.291. The third straight line connects the third point and a fourth point at which x is equal to 0.737 and y is equal to 0.263. The curved line connects the fourth point and the first point.

According to another aspect of the present invention, a light source includes the first light emitting device, a first additional light emitting device having a second light emitting element made of a nitride-based semiconductor to emit green light, and a second additional light emitting device having a third light emitting element made of a nitride-based semiconductor to emit blue light.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
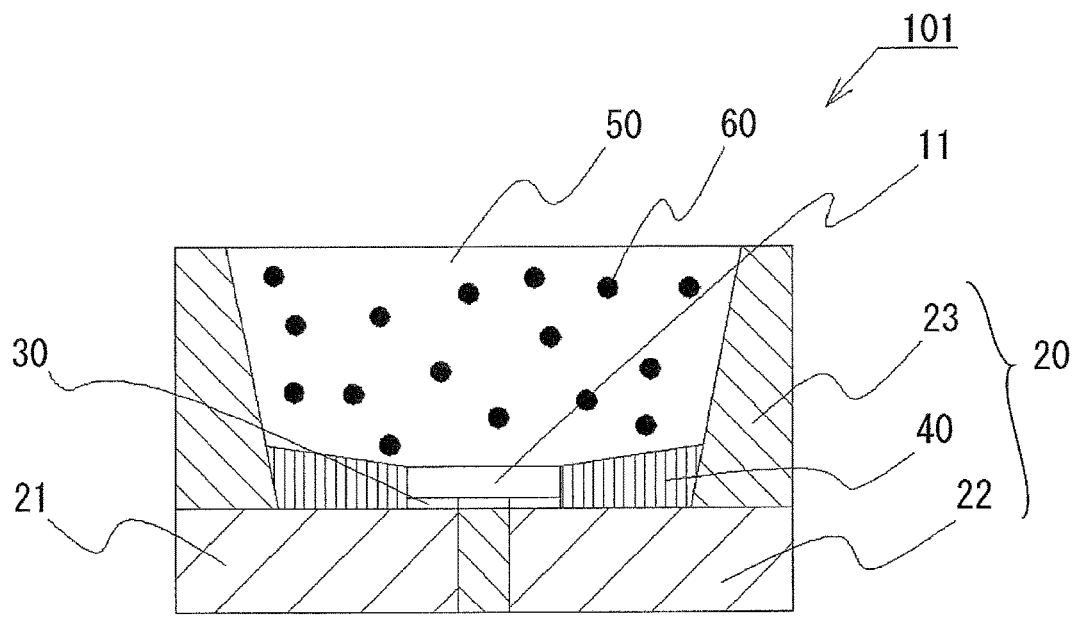
FIG. 1 is a schematic cross-sectional view showing an example of light emitting device according to a first embodiment.

The embodiments will now be described with reference to the accompanying drawings, wherein like reference numerals designate corresponding or identical elements throughout the various drawings.

A first light emitting device (a light emitting device) according to a first embodiment will be described by way of the Embodiments and Examples. However, the present invention is not to be limited only to these embodiments and examples. The embodiments illustrated below are intended as illustrative of a first light emitting device to give concrete forms to technical ideas of the present invention, and the scope of the invention is not limited to the first light emitting device to those described below.

The relation between the color names and the chromaticity coordinates, the relation between the range of wavelength of light and the color name of single color light, and the like conform to JIS Z8110. More specifically, the wavelengths of 380 nm to 410 nm correspond to purple light, 410 nm to 455 nm correspond to blue purple light, 455 nm to 485 nm correspond to blue light, 485 nm to 495 nm correspond to blue green light, 495 nm to 548 nm correspond to green light, 548 nm to 573 nm correspond to yellow green light, 573 nm to 584 nm correspond to yellow light, 584 nm to 610 nm correspond to yellow red light, and 610 nm to 780 nm correspond to red light.

Also, a numerical range indicated using "to" in the present specification represents a range including numerical values described before and after "to" as a minimum value and a maximum value, respectively. Further, the "content of each component in the composition" indicates that in the case where a plural number of substances corresponding to each component are present in the composition, refers to a total amount of the plural number of substance in the composition.

First Light Emitting Device

Figure 2:
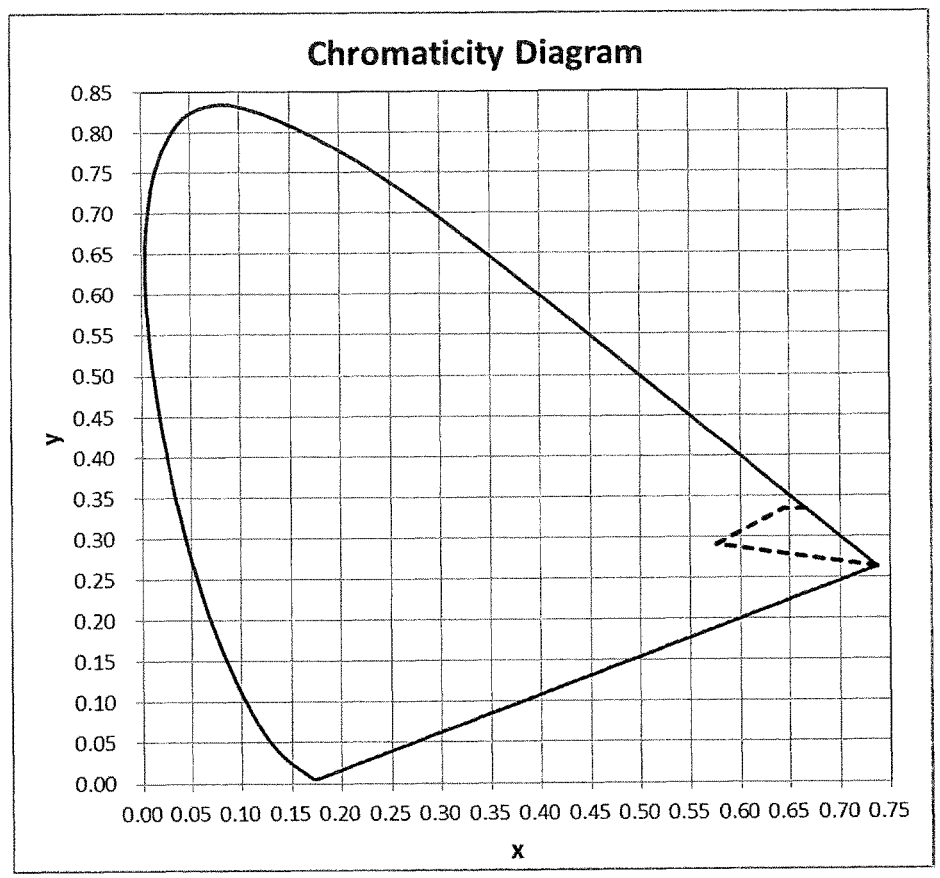
FIG. 2 is a CIE 1931 chromaticity diagram showing a range of chromaticity coordinates of light emitted by a light emitting device according to the first embodiment.

A first light emitting device will be illustrated below with reference to accompanying drawings. FIG. 1 is a schematic cross-sectional view showing an example of light emitting device according to a first embodiment. FIG. 2 is a CIE 1931 chromaticity diagram showing a range of chromaticity coordinates of light emitted by a light emitting device according to the first embodiment.

The first light emitting device 101 is configured to emit light in a range of, for example, 380 nm to 485 nm, and may include a first light emitting element 11 which is a gallium nitride-based compound semiconductor having a first peak emission wavelength in a range of 420 nm to 480 nm, and a package 20 visible light (for example, 380 nm to 485 nm), and a molded body 20 where the light emitting element 11 is mounted. The package 20 includes a first lead 21, a second lead 22, and a fixing part 23. The package 20 is provided with a recess defined by a bottom surface and at least one lateral surface. The first lead 21 and the second lead 22 are arranged in the bottom surface and the fixing part 23 that is electrically insulating is arranged to insulate the first lead 21 and the second lead 22. The first light emitting element 11 is mounted on the bottom surface of the recess of the package 20. The first light emitting element 11 has positive and negative electrodes at a same surface side, and is mounted in a face-down manner. The first light emitting element 11 is electrically connected to the first lead 21 and the second lead 22 by the electrically conductive member 30, respectively. The first light emitting element 11 is covered by the sealing member 50 that contains a fluorescent material 60.

Instead of face-down mounting, the first light emitting element 11 may be mounted in a face-up manner. When a face-up mounting is employed, the first light emitting element 11 may be electrically connected to the first lead 21 and the second lead 22 by using wires, respectively, instead of using the electrically conductive member 30.

The first light emitting device 101 includes a light source that mainly includes the first light emitting element 11 having a first peak emission wavelength in a range of 420 nm to 480 nm and at least one fluorescent material 60 having a second peak emission wavelength in a range of 610 nm to 750 nm. In the specification, the expression "mainly includes" refers to inclusion of fluorescent material that contributes to light emission.

The first light emitting device 101 is configured to emit light in a range corresponding to an enclosed area in the CIE 1931 chromaticity diagram, obtained by determining a first point at chromaticity coordinates of x=0.666, y=0.334, a second point at chromaticity coordinates of x=0.643, y=0.334, a third point at chromaticity coordinates of x=0.576, y=0.291, and a fourth point at chromaticity coordinates of x=0.737, y=0.263, then assuming a first straight line between the first point and a second point, a second straight line between the second point and the third point, and a third straight line between the third point and the fourth point, and, enclosing an area with the first, second, and third straight lines and a curved line between the fourth point and the first point in the chromaticity diagram.

With this configuration, the first light emitting device 101 that can emit light of predetermined red color with high luminance can be provided.

The first light emitting element 11 has a first peak emission wavelength in a range of 420 nm to 480 nm, preferably in a range of 440 nm to 460 nm, more preferably in a range of 445 nm to 455 nm. The first light emitting element 11 has an appropriate half value width of the emission spectrum, which is preferably 30 nm or less.

In the emission spectrum of the first light emitting device, when the maximum intensity of the second peak emission wavelength is assumed to 1, the relative intensity of the first peak emission wavelength is preferably in a range of 0.005 to 0.02. Mixing light having the first peak emission wavelength and light having the second peak emission wavelength with a predetermined ratio, the first light emitting device 101 to emit red light with high luminance can be provided. The first light emitting device 101 that can emit red light is realized by increasing the amount of light absorbed by the fluorescent material 60 and significantly reducing the amount of light from the light emitting element 11 that is discharged to the outside from the first light emitting device 101. If discharging of light from the first light emitting element 11 to the outside is totally blocked, the amount of light discharged from the first light emitting device 101 to the outside decreases, and the first light emitting device 101 of high luminance cannot be obtained. Accordingly, when the maximum intensity at the second peak emission wavelength is set to 1, the relative intensity at the first peak emission wavelength is preferably in a range of 0.005 to 0.02, particularly preferably in a range of 0.005 to 0.01.

The at least one fluorescent material 60 is at least one selected from the group consisting of a (Sr,Ca)AlSiN$_3$:Eu fluorescent material, a CaAlSiN$_3$:Eu fluorescent material, and a K$_2$SiF$_6$:Mn fluorescent material. Accordingly, the first light emitting device with high luminance can be provided.

The at least one fluorescent material 60 is preferably a combination of a (Sr,Ca)AlSiN$_3$:Eu fluorescent material and a CaAlSiN$_3$:Eu fluorescent material. With this combination, absorption of light between the (Sr,Ca)AlSiN$_3$:Eu fluorescent material and the CaAlSiN$_3$:Eu fluorescent material can be reduced, and the first light emitting device of predetermined brightness can be provided. That is, the peak emission wavelength of the (Sr,Ca)AlSiN$_3$:Eu fluorescent material is 10 nm or more longer than the peak emission wavelength of the CaAlSiN$_3$:Eu fluorescent material, so that the first light emitting device 101 that can emit deeper red light can be provided.

It is preferable that the first light emitting device 101 further includes a light-reflecting member 40 covering lateral surfaces of the first light emitting element 11 and a sealing member 50 covering the upper surface of the first light emitting device 11 and containing the fluorescent material 60. With this arrangement, a large amount of light emitted from the lateral surfaces of the first light emitting element 11 can be directed in a front direction. Also, covering the upper surface of the first light emitting element 11 and the upper surface of the reflecting member 40 by the fluorescent material 60 can reduce the amount of returning light that is emitted from the first light emitting element 11 and incident on and reflected from the fluorescent material 60 and other component members toward the first light emitting element 11. Thus, the amount of light emitted from the first light emitting element 101 to the outside may be decreased when the returning light incident on the lateral surfaces of the first light emitting element 11 and propagates within the first light emitting element 11.

The sealing member 50 is preferably arranged in order from the side proximate to the first light emitting element 11, a layer containing the $CaAlSiN_3$:Eu fluorescent material, and a layer containing the $(Sr,Ca)AlSiN_3$:Eu fluorescent material. With this arrangement, the amount of light emitted from the $(Sr,Ca)AlSiN_3$:Eu fluorescent material and absorbed by the $CaAlSiN_3$:Eu fluorescent material can be reduced, thus, the first light emitting device 101 of higher efficiency can be provided.

It is preferable that the sealing member 50 includes, from the side proximate to the side distal to the first light emitting element 11, the first layer containing a fluorescent material and the second layer containing a fluorescent material, with an interface between the first layer and the second layer. When the content amount of the fluorescent material contained in the first layer is assumed 100%, the content of the fluorescent material contained in the second layer is in a range of 1% to 60%. Providing the interface between the first layer and the second layer can reduce the amount of light returning to the first layer from the second layer. Also, containing a lower content of the fluorescent material in the second layer than that in the first layer allows for an increase in the amount of light emitted from the first light emitting element 11 and the fluorescent material contained in the first layer.

The content of the fluorescent material 60 is preferably in a range of 45 to 80 parts by weight with respect 100 parts by weight of the sealing member 50. If the fluorescent material 60 is used to increase the amount of red light, the amount of light emitted from the first light emitting device 101 to the outside decreases. Thus, the content amount of the fluorescent material 60 is preferably in the predetermined range.

The first light emitting element 11 is preferably a nitride-based semiconductor. Because of its good heat resistance and good optical resistance.

It is preferable that the first light emitting device 101 further includes a dielectric multilayer film on the sealing member 50. The light of the first light emitting element 11 that is emitted from the first light emitting device 101 to the outside can be returned toward the fluorescent material side by the dielectric multilayer film. Thus, the first light emitting device 101 that can efficiently emit predetermined red light can be provided. For example, dispersing the fluorescent material allows for a reduction in the amount of light that is blocked by the fluorescent material contained in the upper layer, which allows for an increase in the amount of light emitted from the fluorescent material and discharged to the outside from the first light emitting device. On the other hand, this arrangement can facilitate the propagation of light from the first light emitting element among the fluorescent material, which may result in an increase in the amount of light leaking from the first light emitting device to the outside. However, the light leaking to the outside can be reflected by the dielectric multilayer film and made incident on the fluorescent material. Thus, the amount of light emitted from the first light emitting element and discharged from the first light emitting device to the outside can be reduced.

The first light emitting device 101 can exhibit each chromaticity coordinates at the points as described above, with a difference in the range of chromaticity coordinates at an ambient temperature of 25° C., and the range of chromaticity coordinates at an ambient temperature of 150° C., within a range of x=0.010, and y=0.010. As described above, the first light emitting device 101 that exhibits small change in the chromaticity in spite of a change in the ambient temperature. In the applications requiring a certain range of chromaticity, such as warning lights and indicator lights, occurrence of large shifts in color is undesirable. Therefore, the first light emitting device 101 that can provide small maximum allowable shifts in chromaticity can be significantly useful.

Examples of the type of the light emitting device 101 include a lamp-type and a surface-mounted type, and a chip type. Generally, the term (a) "lamp-type" refers that a resin material forming the external surface of a light emitting device is formed in a lamp-shape. For example, a lamp-type light emitting device includes a lead member having a cup-shape at one side, a light emitting element arranged in the cup, and a sealing resin member covering the light emitting element and a portion of the lead member. Meanwhile, a "surface-mounted type" light emitting device refers to that a light emitting element is placed in a recess-shaped housing and resin is applied in the recess to cover the light emitting element. The recess-shaped housing may be formed by using a material such as thermoplastic resin, thermosetting resin, ceramics, or a metal. A "chip type" light emitting device refers to that without providing a recess-shaped housing, a fluorescent material is applied on a light emitting element, and lateral surfaces of the light emitting element, or the like is fixed by a resin material. For a chip type light emitting device, a layer containing a fluorescent material can be applied in a plate-like shape, or may be applied in a lens shape.

In the description below, a surface-mounted type will be illustrated.

Light Emitting Element

The first light emitting element has a peak emission wavelength in a range of 420 nm and 480 nm. The use of a light emitting element that has an emission peak wavelength in the range shown above as an excitation light source allows for obtaining of a light emitting device to emit light of mixed color of the light emitted from the light emitting element and fluorescent light emitted from the phosphors.

For the first light emitting element, a semiconductor light emitting element can be preferably used. Because a semiconductor light emitting element can provide high linearity of outputting to inputting in high efficiency, and has high tolerance to mechanical impacts and stability. For example, a semiconductor light emitting element configured to emit light of a blue-purple color or a blue color, using a nitride-based semiconductor ($In_XAl_YGa_{1-X-Y}N$, $0 \leq X$, $0 \leq Y$, $X+Y \leq 1$) etc., can be used. Emission from the first light emitting element emit is mainly light of blue-purple color or blue color that includes little ultraviolet component, so that deterioration of the components of the first light emitting device can be reduced and adverse effect on a human body can be reduced.

Package

A surface-mounted type package has a first lead, a second lead, and a fixing part. For a surface-mounted type package, a top-view type that is used to emit light in a direction approximately perpendicular to the mounting surface, or a side-view type that is used to emit light in a direction approximately in parallel to the mounting surface, is mainly employed, and either type can be employed in the present disclosure. The first lead and the second lead are made of a plate-shaped metal. When viewed from the opening of the recess, the first lead and the second lead are not projected outside of the fixing part, but a configuration in which the first lead and/or the second lead projecting outside of the fixing part can also be employed.

Examples of preferable materials for the first lead and the second lead include, a metal having a thermal conductivity of about 200 W/(m·K) or greater, a material having relatively large mechanical strength, and a material which can be easily processed in pressing or etching. More specific examples of such materials include metals such as copper, aluminum, gold, silver, tungsten, iron, nickel, and alloys such as iron-nickel alloy and phosphor bronze. A base material covered with a metal such as silver, aluminum, or gold, having higher optical reflectance than the base material may also be employed.

For the fixing part, resin such as thermoplastic resin or thermosetting resin, inorganic material such as ceramics, a metal covered by an insulating material, or the like, can be used. Also, a light-reflecting material is preferably contained in the resin or the like, of the fixing part.

Electrically Conductive Member

The electrically conductive member is configured to fix the first light emitting element to the package, and to electrically connect the positive and negative electrodes of the first light emitting element to the first lead and the second lead, respectively. For the electrically conducting bonding member, an appropriate material can be selected according to a purpose, examples thereof include electrically conductive paste of silver, gold, palladium, or the like, and solder such as tin-bismuth-based solder, tin-copper-based solder, tin-silver-based solder, gold-tin-based solder, or the like, a brazing material such as a low-melting-point metal.

Reflecting Member

The reflecting member covers one or more lateral surfaces of the first light emitting element and upper surfaces of the first and second leads. The reflecting member is preferably arranged so that at a portion in contact with the first light emitting element, the reflecting member is approximately in a same plane or at lower than the upper surface of the first light emitting element. The reflecting member is preferably arranged in contact with one or more lateral surfaces that define the recess. The reflecting member may be made of particles such as titanium oxide or barium titanate, and may be fixed, directly or via an adhesive material or the like, on the first lead and the second lead.

Sealing Member

The sealing member can be made of any appropriate material that is electrically insulating and allows the light emitted from the first light emitting element and the fluorescent material to pass through, and has fluidity before it is solidified or hardened. Examples of the sealing member include thermoplastic resin, thermosetting resin, and glass. More specific examples of the thermosetting resin include epoxy resin, silicone resin, and modified silicone resin such as epoxy-modified silicone resin. Among those, a silicone resin is preferable because of it has high heat-resistance and high light-resistance, and exhibits a small volume contraction in solidifying or hardening.

The sealing member preferably can disperse a fluorescent material. As long as the state of the dispersion is not adverse, presence of small amount of precipitation of the fluorescent material, or occurrence of concentration difference in the dispersed fluorescent material can be allowed. That is, uniform dispersion of the fluorescent material by using a sealing member having high viscosity is preferable, but instead, a sealing member having slightly lower viscosity may be employed to reduce the hardening time, while a portion of the fluorescent material is allowed to be precipitated but most of the fluorescent material is dispersed. At the time of mixing fluorescent material particles in the sealing member, if a sealing member having a high viscosity is used, a higher viscosity may result depending on the amount of the fluorescent material, which makes it difficult to obtain uniform dispersion of the fluorescent material particles. With the use of a sealing member having lower viscosity, a rise in the viscosity can be reduced, which allows dispersion of higher concentration of the fluorescent material particles.

At the time of uniformly dispersing the fluorescent material, other components such as a light diffusing material may also be included as needed.

The sealing member can be formed with a single layer, or with a plurality of layers, such as two layers or three layers. For example, the sealing member may include a first layer proximate to the first light emitting element and a second layer distal to the first light emitting element, further, an interface may be present between the first layer and the second layer. The first layer and the second layer may be made of the same material. The first layer and the second layer may be made of different materials.

For example, providing a second layer that has a refractive index greater than that of the first layer allows to reflect light emitted from the first light emitting element at the interface between the first layer and the second layer, so that the light from the first light emitting element can be returned to the first layer side, which can increase the amount of light incident on the fluorescent material.

Alternatively, providing a second layer that has a refractive index smaller than that of the first layer allows to efficiently transmit light emitted from the fluorescent material contained in the first layer to the second layer, so that the light extraction efficiency from the first light emitting device to the outside can be increased.

Fluorescent Material

The fluorescent material can absorb light emitted from the first light emitting element and emit light of different wavelength. The present embodiment employs at least one fluorescent material that can absorb light from the first light emitting element having a first peak emission wavelength in a range of 420 nm to 480 nm and emit light having a second peak emission wavelength in a range of 610 nm to 750 mm. That is, the fluorescent material emits a red light. The fluorescent material has a second peak emission wavelength in a range of 610 nm to 750 nm, and the emission spectrum covers a range of wavelengths from 610 nm to 750 nm. The first light emitting element preferably has a second peak emission wavelength in a range of 610 nm to 680 nm, more preferably in a range of 610 nm to 650 nm. Because the luminosity efficiency factor has a peak at 555 nm which decreases toward longer wavelength, and thus, a fluorescent material having a second peak wavelength in a range of 610 nm to 650 nm is preferable to improve the luminance.

At least one type of fluorescent material is contained in the sealing member, but the use of two or three types of fluorescent materials is preferable. Because, the increase in the number of fluorescent materials requires consideration of deterioration, change in thermal characteristics, and so forth of each fluorescent material, which increases difficulty in controlling.

Specific examples of the fluorescent materials include, SCASN-based fluorescent materials such as $(Sr,Ca)AlSiN_3$:Eu, CESN-based fluorescent materials such as $CaAlSiN_3$:Eu, CESN fluorescent materials such as $Ca_2Si5N_8$:Eu, $(Sr,Ca)_2Si5N_8$:Eu, and KSF-based fluorescent materials such as $K_2SiF_6$:Mn. Of those, at least one SCASN-based fluorescent material and at least one CASN-based fluorescent material, or a combination of a plurality of SCASN-based and CASN-based fluorescent materials are preferably used. Note that among the SCASN-based fluorescent materials, different ratio of Sr and Ca may result different emission color, so that fluorescent materials having a difference in the peak emission wavelengths 5 nm or greater are determined as different fluorescent materials.

The first light emitting device according to claim 1, wherein in an emission spectrum of the first light emitting device, when a maximum intensity of the first peak emission wavelength is assumed to 1, a relative intensity of the first peak emission wavelength is in a range of 0.005 to 0.02. The relative intensity can be adjusted by the type and the use amount of the fluorescent material.

The content mass % of the fluorescent material can be determined by measuring characteristic x-rays released when a cross section of the first light emitting device is irradiated by electron beams, using a scanning electron microscope. For example, the measurement may be performed by using a scanning electron microscope S-4700 manufactured by Hitachi, Ltd.

In the case where the phosphor member includes one or more other components, the contents thereof can be suitably set according to purpose and the like. In view of light extraction efficiency, the average particle diameter of the fluorescent material is preferably in a range of 1 μm to 20 μm, more preferably in a range of 5 μm to 15 μm.

Light Diffusing Material and Other Components

A light diffusing material is preferably contained in the sealing member to obtain more uniform dispersion of the fluorescent material in the sealing member. For the light diffusing material, silica, alumina, magnesium oxide, antimony oxide, aluminum oxide, barium sulfate, magnesium oxide, barium carbonate, barium titanate, or the like can be used, among those, silica is preferably used. The particle diameter of silica may be in a range of 1 to 300 μm, preferably in a range of 1 to 50 μm. The refractive index of silica to be used is in a range of 1.46 to 1.53, and with the use of silicone resin having a refractive index in a range of 1.54 to 1.56 for the sealing member, the reflectance can be improved. The content of the light diffusing material may be in a range of 0.1 to 10 parts by weight, preferably in a range of 0.8 to 2 parts by weight, with respect to 100 parts by weight of the sealing member.

When needed, the sealing member may include one or more other components in addition to the fluorescent material and the light diffusing material. Examples of other components include a filler material, an optical stabilizer, a coloring agent, and an antioxidant. The filler material is used with the aim to increase the strength of the fixing part of the package, or the like, rather than aiming to reflect light. In the case where the sealing member includes one or more other components, the contents thereof can be suitably set according to purpose and the like. For example, in the case of including a filler material, the content of the filler material can be in a range of 0.01 to 20 parts by weight with respect to 100 parts by weight of the sealing resin.

Light Source

The first light emitting device can be applied in a light source that includes the first light emitting device, a second light emitting device (a first additional light emitting device) having a second light emitting element made of a nitride-based semiconductor and configured to emit green light, and a third light emitting device (a second additional light emitting device) having a third light emitting element made of a nitride-based semiconductor and configured to emit blue light. The light source is a so-called a three-in one light source, employing three primary colors of light, and is corresponding to a single pixel in a display image.

In the conventional light sources employing a red light emitting element made of GaP, GaAs, or the like, in combination of a green light emitting element and a blue light emitting element as described above, due to a difference in thermal characteristics between GaP, GaAs, or the like, and the nitride-based semiconductors, shifts in color have been occurred as the temperature changes. When the red light emitting element made of GaP, GaAs, or the like is used and the ambient temperature of the light emitting element is raised from 25° C., to 150° C., occurrence of a shift in color due to a shift in the peak emission wavelength of about 20 nm to 30 nm to a shorter wavelength side has been observed.

On the other hand, in a light source that includes the first light emitting device using the first light emitting element that is a nitride-based semiconductor, the second light emitting device (the first additional light emitting device) having the second light emitting element made of a nitride-based semiconductor and configured to emit green light, and a third light emitting device (the second additional light emitting device) having a third light emitting element made of a nitride-based semiconductor and configured to emit blue light, all the light emitting elements are made of nitride-based semiconductors and having common thermal characteristics. Thus, shifts in color may be very small even in occurrence of change in the temperature. In particular, when the first light emitting element that is a nitride-based semiconductor is used, and the ambient temperature of the light emitting element is raised from 25° C., to 150° C., a shift of the peak emission wavelength in the emission spectrum is merely 3 nm or less, and a significant shift in color has not been observed.

Occurrence of color shifts of a light source for direct-view applications such as display may be a significant obstacle. Therefore, the light source according to the present embodiment can be very advantageous in that color shifts of the light source can be substantially prevented.

EXAMPLES

Next, the present disclosure will be more specifically described with reference to examples, which however are not intended to limit the present invention.

Figure 3:
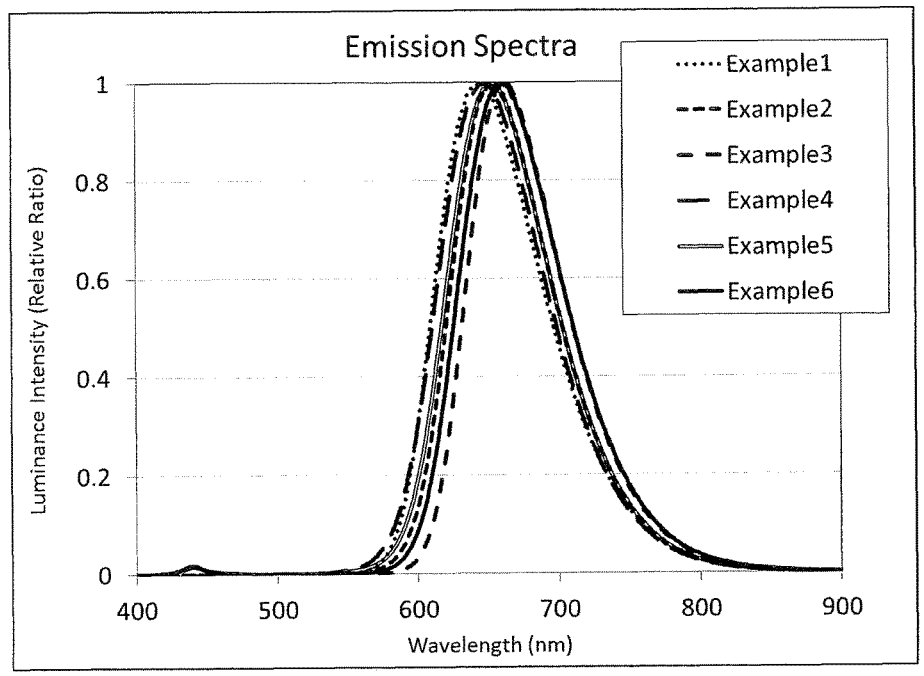
FIG. 3 is a diagram showing emission spectra of light emitting devices according to Examples 1 to 6.
Figure 4:
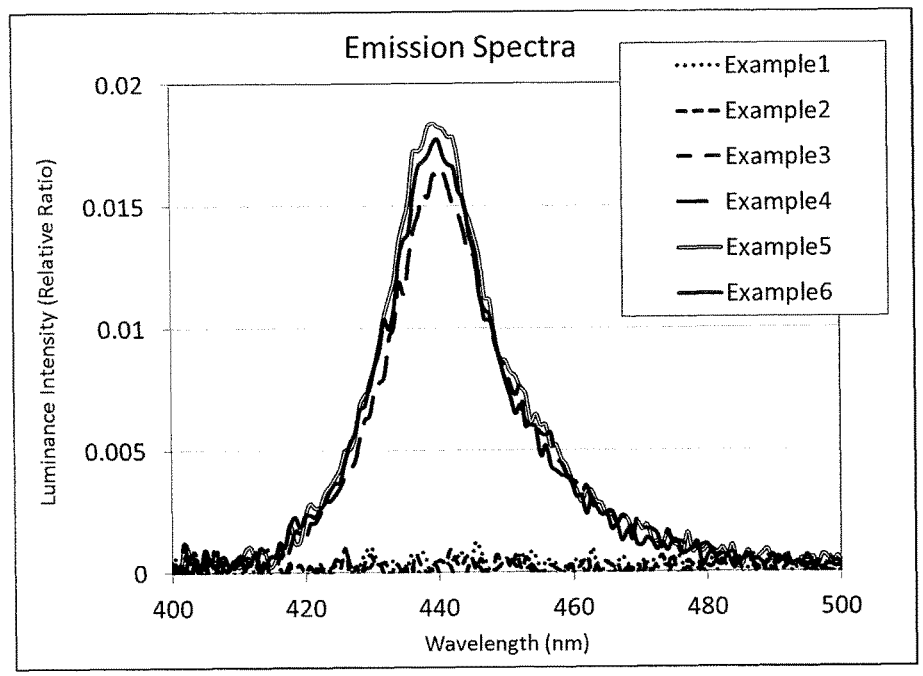
FIG. 4 is a diagram showing emission spectra of light emitting devices according to Examples 1 to 6.
Figure 5:
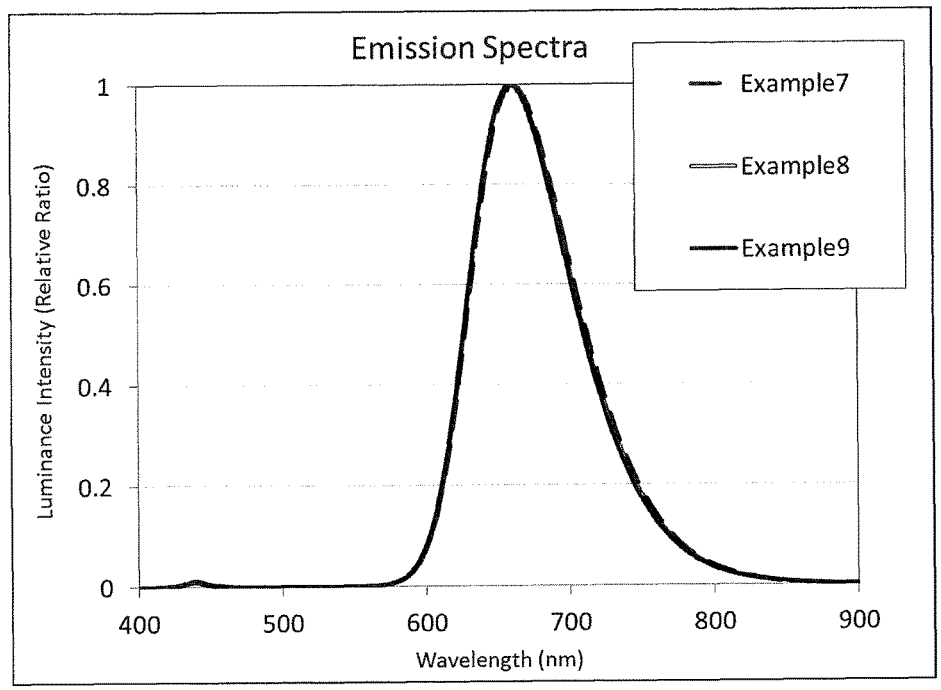
FIG. 5 is a diagram showing emission spectra of light emitting devices according to Examples 7 to 9.
Figure 6:
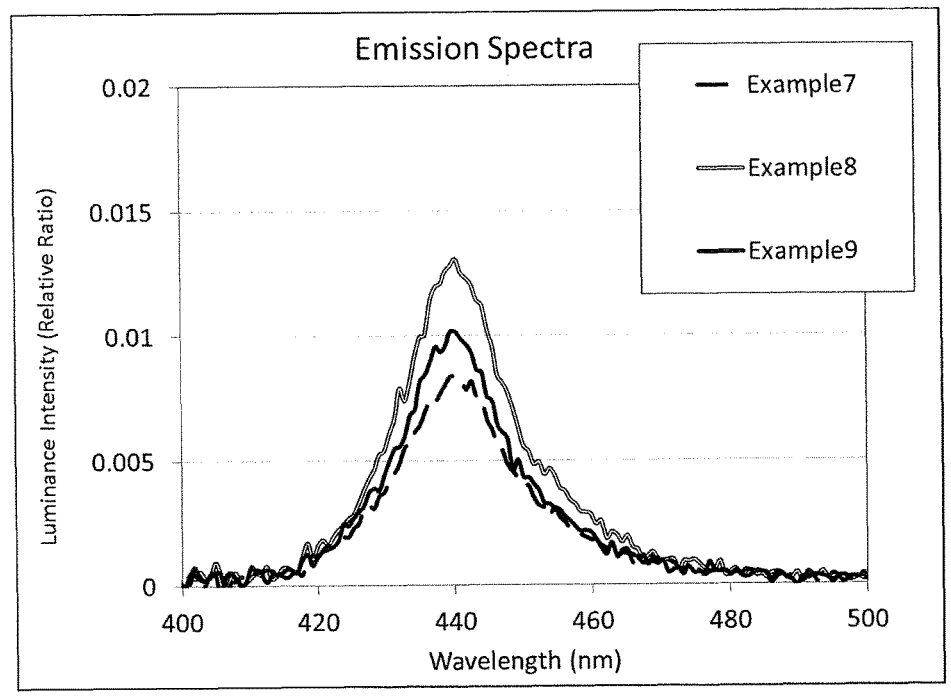
FIG. 6 is a diagram showing emission spectra of light emitting devices according to Examples 7 to 9.
Figure 7:
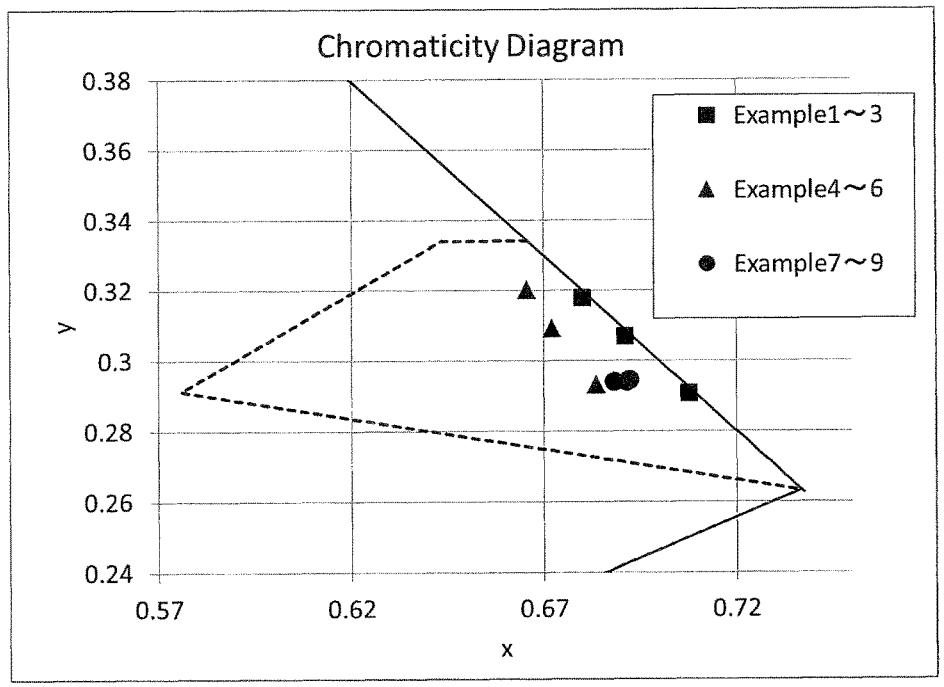
FIG. 7 is a diagram showing a range of chromaticity coordinates of light emitted by light emitting devices according to the Examples 1 to 9.
Figure 8:
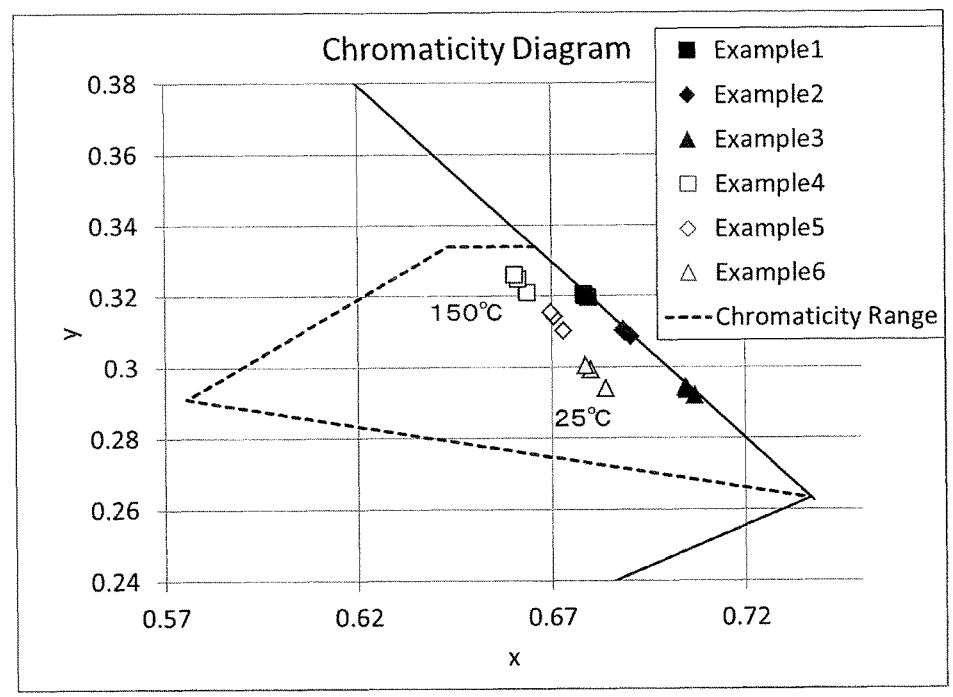
FIG. 8 is a diagram showing a range of chromaticity coordinates of light emitted by light emitting devices at an ambient temperature of 25° C., and 150° C., respectively, according to the Examples 1 to 6.

Next, the first light emitting devices of Examples 1 to 9 will be described. FIG. 3 is a diagram showing emission spectra of light emitting devices according to Examples 1 to 6. FIG. 4 is a diagram showing emission spectra of light emitting devices according to Examples 1 to 6. FIG. 5 is a diagram showing emission spectra of light emitting devices according to Examples 7 to 9. FIG. 5 shows emission spectra at a range of 400 nm to 900 nm. FIG. 6 is a diagram showing emission spectra of light emitting devices according to Examples 7 to 9. FIG. 6 shows emission spectra at a range of 400 nm to 500 nm. FIG. 7 is a diagram showing a range of chromaticity coordinates of light emitted by light emitting devices according to the Examples 1 to 9. FIG. 8 is a diagram showing a range of chromaticity coordinates of light emitted by light emitting devices at an ambient temperature of 25° C., and 150° C., respectively, according to the Examples 1 to 6.

Examples 1 to 6

Table 1 shows powder properties and luminous characteristics of the fluorescent materials A to D. As the luminous characteristics of the fluorescent materials A to D, the chromaticity coordinates x and y of fluorescent light emitted by an excitation light of 460 nm. The average particle size of each of the fluorescent materials is listed as a Fisher number measured by using a Fisher Sub-Sieve Sizer (manufactured by Thermo Fisher Scientific Co.) that employs an air permeable method. The median particle size Dm is a volume median particle size measured by using a Coulter Multisizer II (manufactured by Beckman Coulter Inc.) that determines the electric resistance of particles.

TABLE 1

| | Composition | Average Particle Diameter: (μm) | Dm (μm) | 460 nm-Excitation Light Emission Properties | |
|---|---|---|---|---|---|
| | | | | x | y |
| Fluorescent Material A | $(Sr,Ca)AlSiN_3:Eu$ | 10.0 | 17.0 | 0.643 | 0.348 |
| Fluorescent Material B | $CaAlSiN_3:Eu$ | 12.0 | 15.0 | 0.644 | 0.349 |
| Fluorescent Material C | $CaAlSiN_3:Eu$ | 14.0 | 16.0 | 0.670 | 0.321 |
| Fluorescent Material D | $CaAlSiN_3:Eu$ | 13.6 | 15.0 | 0.678 | 0.312 | the fluorescent materials B and C, in Example 6, the fluorescent materials C and D are respectively used in a mixture. In the present specification, the term "main wavelength" refers to a wavelength at a point obtained by connecting a chromaticity point of a white light and the chromaticity point of light emitted by each of the first light emitting devices by a straight line, and determining the point of intersection of an extension line of the straight line and the locus of a monochromatic light.

The fluorescent materials A to D described above are contained in the sealing member at predetermined ratios, and mixed and dispersed, and further degassed, to obtain respective fluorescent material-containing resin compounds. The percentage contents of the fluorescent materials shown in the tables are respectively weight percentages based on the weight of the sealing member as 100%.

Next, the fluorescent material-containing resin composition is injected to enclose the first light emitting element, and heat treating is applied at about 150° C., for four hours to harden the resin composition.

Through the steps as described above, each of the first light emitting devices is produced.

In the first light emitting devices of Examples 1 to 6, a light diffusing material is not added.

Table 2 shows luminous characteristics of the first light emitting devices of Examples 1 to 6.

TABLE 2

| | Fluorescent Material | Fluorescent Material/Resin (%) | Luminous Efficiency (lm/W) | Chromaticity Coordinates | | Dominant Wavelength (nm) |
|---|---|---|---|---|---|---|
| | | | | x | y | |
| Example 1 | Fluorescent Material A | 55 | 14.5 | 0.680 | 0.318 | 615.8 |
| Example 2 | Fluorescent Material B | 95 | 10.5 | 0.691 | 0.307 | 620.9 |
| Example 3 | Fluorescent Material C | 80 | 6.6 | 0.708 | 0.291 | 631.3 |
| Example 4 | Fluorescent Material A, B | 35 | 17.8 | 0.666 | 0.320 | 615.1 |
| Example 5 | Fluorescent Material B, C | 50 | 15.2 | 0.672 | 0.309 | 620.5 |
| Example 6 | Fluorescent Material C, D | 35 | 11.0 | 0.684 | 0.293 | 631.6 |

Figure 10:
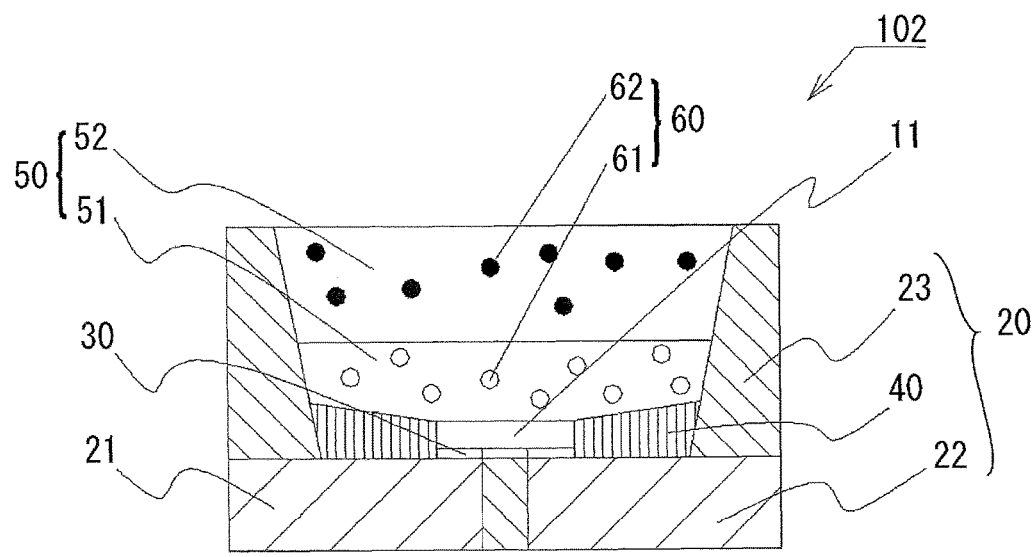
FIG. 10 is a schematic cross-sectional view of a first light emitting device according to Examples 10 to 16.

FIG. 10 is a schematic cross-sectional view of a first light emitting device according to Examples 1 to 6. In the below, similar to those in the first embodiments may be appropriately omitted.

For the first light emitting element to be used in the first light emitting devices of Examples 1 to 6, a nitride-based semiconductor light emitting element having a first peak emission wavelength λp at about 447 nm is used. For the fluorescent materials A to D to be used in the first light emitting devices of Examples 1 to 6, fluorescent materials respectively having a peak emission wavelength in a range of 610 nm to 750 nm are used. For the packages used in the first light emitting devices of Examples 1 to 6, NJSW172A manufactured by Nichia Corporation are used, and for the sealing member, silicone resin (JR-9023NW, manufactured by Shin-Etsu Chemical Co., Ltd) is used.

The fluorescent materials A to D are used so that the main wavelengths of the light emitted from the first light emitting devices are approximately 615 nm, 620 nm, and 630 nm, respectively. In Example 1, the fluorescent material A, in Example 2, the fluorescent material B, in Example 3, the fluorescent material C, are used singly, respectively. In Example 4, the fluorescent materials A and B, in Example 5, The first light emitting devices of Examples 1 to 6 are configured to emit predetermined red light, respectively. At an approximately same main wavelength, Example 4 exhibits higher luminous efficiency than Example 1. Also, in Example 4, a smaller ratio of the fluorescent material is used, which indicates a smaller cost in manufacturing the first light emitting device. Also, at an approximately same main wavelength, Example 5 exhibits higher luminous efficiency than Example 2. Further, at an approximately same main wavelength, Example 6 exhibits higher luminous efficiency than Example 3. In those examples, light from the first light emitting devices can be irradiated efficiently on the fluorescent materials while efficiently extracting light from the fluorescent materials to the outside without blocking light by other fluorescent material particles, thus allowing obtaining of high light luminous efficiencies.

The first light emitting devices of Examples 1 to 6 exhibits very good thermal characteristics, and under the ambient temperature in a range of 25° C., to 150° C., predetermined color reproduction ranges can be realized without significant changes in the chromaticities. That is, the first light emitting devices can exhibit a difference in the range of chromaticity coordinates of the first points at an ambient temperature of 25° C., and the range of chromaticity coordinates of the second points at an ambient temperature of 150° C., which are respectively within a range of x=0.010, and y=0.0010.

Examples 7 to 9

Next, the first light emitting devices of Examples 7 to 9 will be described. Examples 7 to 9 are approximately same as those in Example 6, except for the state of dispersion and content amounts of the fluorescent materials C and D.

For the fluorescent material used in the first light emitting devices of Examples 7 to 9, respective mixture of the fluorescent materials C and D are used.

In Examples 7 to 9, the states of dispersion of the fluorescent materials differ.

In the first light emitting device of Example 7, the fluorescent materials C, D are forcibly precipitated at the bottom side in the recess of the respective first light emitting device by using a centrifugal separator. Most of the fluorescent materials C and D are precipitated at the bottom of the recess of the first light emitting device. The centrifugal separator is operated at a rotating speed of 300 rpm for about 30 minutes.

In the first light emitting device of Example 8, the resin composition containing the fluorescent materials C, D is charged in the recess of the first light emitting device, and left to stand for about 6 hours to allow the precipitate to settle. In the first light emitting device of Example 8, portions of the fluorescent materials C, D are precipitate to the bottom of the recess of the first light emitting device, but portions of the fluorescent materials C, D are not precipitate to the bottom of the recess and stay dispersed in the resin composition.

In the first light emitting device of Example 9, the resin composition containing the fluorescent materials C, D and a light diffusing material is charged in the recess of the first light emitting device, and the resin composition is cured while the fluorescent materials C, D are kept in the dispersed state.

In the Examples 7 to 9, the first light emitting devices are configured to have an approximately same main wavelength. Note that, in Examples 7 to 9, different state of dispersions are employed, which may lead to different chromaticities of the first light emitting devices, so that the contents of the fluorescent materials C, D are adjusted to obtain predetermined chromaticities.

In the first light emitting devices of Examples 7 to 9, in order to determine the content rate of the fluorescent material in the sealing member, the sealing member is divided in half between the upper surface and the upper surface of the light emitting element. The upper surface side of the sealing member is indicated as an upper part, and the first light emitting element side of the sealing member is indicated as a lower part, than the content ratio of the fluorescent material of the upper part with respect to the lower part is measured.

Table 3 and Table 4 show luminous characteristics of the first light emitting devices of Examples 7 to 9.

TABLE 3

|  | Fluorescent Material | Fluorescent Material Dispersion State | Fluorescent Material/Resin (%) | Luminous Efficiency (lm/W) | Chromaticity Coordinates x | Chromaticity Coordinates y | Dominant Wavelength (nm) |
| --- | --- | --- | --- | --- | --- | --- | --- |
| Example 7 | Fluorescent Material C, D | Forced Sedimentation | 35 to 40 | 10.0 | 0.692 | 0.294 | 629.5 |
| Example 8 | Fluorescent Material C, D | Plain Sedimentation | 35 to 40 | 10.5 | 0.688 | 0.294 | 630.3 |
| Example 9 | Fluorescent Material C, D | Dispersion | 45 to 50 | 10.7 | 0.691 | 0.294 | 629.9 |

TABLE 4

|  | Mass Content (%) Upper Portion/Lower Portion (%) | Standard Deviation δ |
| --- | --- | --- |
| Example 7 | 1.26 | 4.05 |
| Example 8 | 4.26 | 2.74 |
| Example 9 | 50.01 | 5.17 |

In Examples 7 to 9, Example 9 exhibits a highest luminous efficiency. In Examples 7 and 8, the fluorescent material is precipitated, so that the lower portion contains a higher density of the fluorescent material. Accordingly, light from the fluorescent material at a lower part may be blocked by the fluorescent material located at a higher part, resulting in confinement of a portion of light from the fluorescent material. On the other hand, in Example 9, the fluorescent material is dispersed, so that the fluorescent material is more sparsely distributed. Thus, the blocking of light from the fluorescent material at a lower side by the fluorescent material at an upper side can be reduced, which increase the output of light from the fluorescent material at the lower side. Further, even when the light emitted from the fluorescent material at a lower side is irradiated on the fluorescent material at an upper side, the light may produce secondary scattering without being absorbed by the fluorescent material at the upper side. The main wavelength may shift toward the longer wavelength side due to the secondary scattering, which allows an increase in the amount of the fluorescent material C that has a higher luminous efficiency than that of the fluorescent material C. In Table 4, the mass content ratio of the fluorescent material includes a deviation due to a statistical error of counting in the characteristic x-rays, and δ indicated a standard deviation.

Examples 10 to 16

Figure 9:
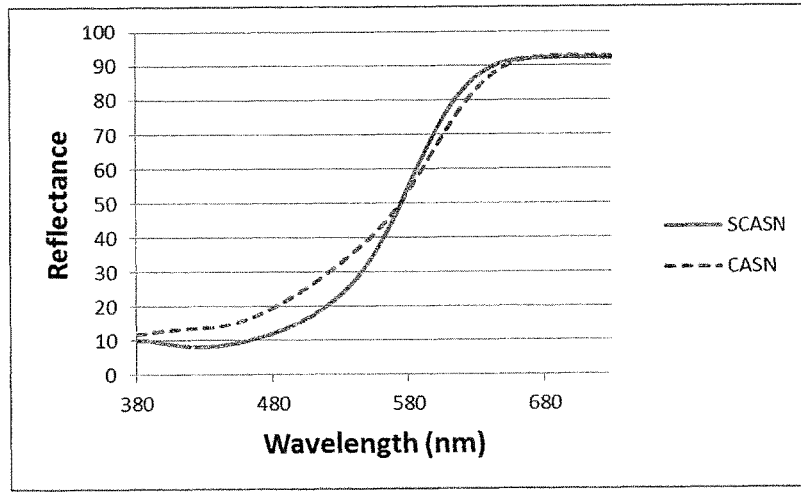
FIG. 9 is a diagram showing powder reflection spectra of a $(Sr,Ca)AlSiN_3$:Eu fluorescent material and a $CaAlSiN_3$:Eu fluorescent material.

Next, the first light emitting devices 102 of Examples 10 to 16 will be described. FIG. 9 is a spectra of powder reflectance of $(Sr,Ca)AlSiN_3$:Eu fluorescent material and $CaAlSiN_3$:Eu fluorescent material. FIG. 10 is a schematic cross-sectional view of the first light emitting devices of Examples 10 to 16.

In Examples 10 to 16, packages NJSW172A, manufactured by Nichia Corporation are used. The first light emitting element has first peak emission wavelength at 447 mm. For the sealing member, silicone resin (KJR-9023, manufactured by Shin-Etsu Chemical Co., Ltd.), for the fluorescent material, $(Sr,Ca)AlSiN_3:Eu$ (SCASN) and $CaAlSiN_3:Eu$ (CASN) are used. The weight ratio of CASN to SCASN is SCASN: CASN=0.64:0.36.

The reflectance of the CASN fluorescent material at about 447 nm is higher than that of the SCASN fluorescent material. In other words, the SCASN fluorescent material absorbs larger amount of light than the CASN fluorescent material. In red region, the SCASN fluorescent material and the CASN fluorescent material have similar reflectance, but in a region of about 400 nm to about 550 nm, the reflectance of the SCASN fluorescent material and the reflectance of the CASN fluorescent material are significantly different. The difference can exert influence on the emission intensity.

A first sealing member 51 disposed closer to the bottom of the recess defined in the package is indicated as a first layer and a second sealing member 52 disposed closer to the opening of the recess is indicated as a second layer. In Examples 10 to 12, the first layer contains a SCASN fluorescent material 61 and the second layer contains a CASN fluorescent material 62, with different fluorescent material concentrations. In Examples 13 to 15, the first layer contains a CASN fluorescent material 62 and the second layer contains a SCASN fluorescent material 61, with different fluorescent material concentrations. In Example 16, a mixture of a SCASN fluorescent material and a CASN fluorescent material is used. In Examples 10 to 16, the fluorescent materials are dispersed.

Table 5 shows luminous characteristics of the first light emitting devices of Examples 10 to 16.

TABLE 5

| | Fluorescent Material Concentration (phr) | Chromaticity Coordinates x | Chromaticity Coordinates y | Luminous Efficiency (lm/W) | Dominant Wavelength (nm) |
|---|---|---|---|---|---|
| Example 10 | 60 | 0.613 | 0.303 | 24.7 | 629.6 |
| Example 11 | 70 | 0.637 | 0.312 | 22.1 | 620.0 |
| Example 12 | 80 | 0.642 | 0.315 | 20.4 | 618.3 |
| Example 13 | 60 | 0.603 | 0.300 | 27.3 | 643.6 |
| Example 14 | 70 | 0.637 | 0.313 | 24.2 | 619.5 |
| Example 15 | 80 | 0.655 | 0.320 | 22.5 | 615.5 |
| Example 16 | 70 | 0.655 | 0.320 | 18.8 | 615.0 |

At a same amount of the fluorescent materials, Example 11 and Example 14 exhibit higher luminous efficiencies of 3.3 to 5.4 (lm/W) compared to that of Example 16, and greater brightness.

At a same amount of the fluorescent materials, Examples 13 to 15 exhibit higher luminous efficiencies of about 2.1 to 2.6 (lm/W) compared to that of Examples 10 to 12, and greater brightness. In Examples 13 to 15, a CASN fluorescent material having a higher reflectance than that of a SCASN fluorescent material is arranged in the first layer, which allows blue light emitted from the first light emitting element and reflected at the interface of the first layer and the second layer can be returned to the first surface, and thus amplifying the emission of the CASN fluorescent material. Arranging the SCASN fluorescent material having a lower reflectance and higher optical absorption than that of the CASN fluorescent material in the second layer can reduce the amount of blue light passing through the second layer. With the configuration described above, the luminance efficiency can be enhanced.

Further, compared to Example 15, Example 13 exhibits a higher luminous efficiency of about 4.8 (lm/W) and greater brightness.

The first light emitting device according to certain embodiments can be applied in wide range of fields such as general lighting, on-vehicle lighting, decorative lighting, warning lamps, and indicators.

It is to be understood that although embodiments of the present invention have been described, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    at least one first light emitting element to emit a first light having a first peak emission wavelength in a range of 420 nm or greater and 480 nm or less; and
    at least one fluorescent material to convert the first light to a second light having a second peak emission wavelength in a range of 610 nm or greater and 750 nm or less, the second light having chromaticity existing in an enclosed area in a CIE 1931 chromaticity diagram in which chromaticity is defined by x and y coordinates, the enclosed area being enclosed with a first straight line, a second straight line, a third straight line, and a curved line, the first straight line connecting a first point at which x is equal to 0.666 and y is equal to 0.334 and a second point at which x is equal to 0.643 and y is equal to 0.334, the second straight line connecting the second point and a third point at which x is equal to 0.576 and y is equal to 0.291, the third straight line connecting the third point and a fourth point at which x is equal to 0.737 and y is equal to 0.263, the curved line connecting the fourth point and the first point.

2. The light emitting device according to claim 1, wherein in an emission spectrum of the light emitting device, when a maximum intensity of the second peak emission wavelength is assumed to 1, a relative intensity of the first peak emission wavelength is in a range of 0.005 to 0.02.

3. The light emitting device according to claim 1, wherein the at least one fluorescent material includes at least one selected from the group consisting of a $(Sr,Ca)AlSiN_3:Eu$ fluorescent material, a $CaAlSiN_3:Eu$ fluorescent material, and a $K_2SiF_6:Mn$ fluorescent material.

4. The light emitting device according to claim 1, wherein the at least one fluorescent material includes a combination of the $(Sr,Ca)AlSiN_3$:Eu fluorescent material and the $CaAlSiN_3$:Eu fluorescent material.

5. The light emitting device according to claim 1 further comprising:
   a light-reflecting member covering lateral surfaces of the at least one first light emitting element, and
   a sealing member covering an upper surface of the at least one first light emitting element and containing the at least one fluorescent material.

6. The light emitting device according to claim 5, wherein the sealing member includes a first fluorescent layer containing the $CaAlSiN_3$:Eu fluorescent material and a second fluorescent layer containing the $(Sr,Ca)AlSiN_3$:Eu fluorescent material, the first fluorescent layer being provided between the at least one first light emitting element and the second fluorescent layer.

7. The light emitting device according to claim 5,
   wherein the sealing member includes a first layer containing the at least one fluorescent material and a second layer containing the at least one fluorescent material, the first layer provided between the at least one first light emitting element and the second layer, an interface being provided between the first layer and the second layer, and
   wherein when a content amount of the at least one fluorescent material contained in the first layer is assumed 100%, a content of the at least one fluorescent material contained in the second layer is in a range of 1% to 60%.

8. The light emitting device according to claim 5, wherein the content of the at least one fluorescent material is in a range of 45 to 80 parts by weight with respect to 100 parts by weight of the sealing member.

9. The light emitting device according to claim 1, wherein the at least one first light emitting element is made of a nitride-based semiconductor.

10. The light emitting device according to claim 1 further comprising a dielectric multilayer film on the sealing member.

11. The light emitting device according to claim 1, wherein a difference in a range of the x and y coordinates at an ambient temperature of 25° C. and a range of the x and y coordinates at an ambient temperature of 150° C. is within a range of x=0.010, and y=0.0010.

12. A light source comprising:
   the light emitting device according to claim 1;
   a first additional light emitting device having a second light emitting element made of a nitride semiconductor to emit green light; and
   a second additional light emitting device having a third light emitting element made of a nitride semiconductor to emit blue light.

* * * * *